United States Patent [19]
Wada et al.

[11] Patent Number: 5,850,367
[45] Date of Patent: Dec. 15, 1998

[54] STATIC TYPE SEMICONDUCTOR MEMORY WITH LATCH CIRCUIT AMPLIFYING READ DATA READ ON A SUB BIT LINE PAIR AND TRANSFERRING THE AMPLIFIED READ DATA TO A MAIN BIT LINE PAIR AND OPERATION METHOD THEREOF

[75] Inventors: Tomohisa Wada; Yoshiyuki Haraguchi, both of Hyogo, Japan

[73] Assignee: Mitsubishi Denki Kabushiki Kaisha, Tokyo, Japan

[21] Appl. No.: 815,986

[22] Filed: Mar. 10, 1997

[30] Foreign Application Priority Data

Nov. 29, 1996 [JP] Japan ................................. 8-319544

[51] Int. Cl.⁶ ................................................. G11C 8/00
[52] U.S. Cl. ......................................... 365/230.03; 365/205
[58] Field of Search ............................... 365/230.05, 205; 327/57

[56] References Cited

U.S. PATENT DOCUMENTS

| | | | |
|---|---|---|---|
| 4,804,871 | 2/1989 | Walters, Jr. ............................ | 327/54 |
| 4,932,002 | 6/1990 | Houston ................................. | 365/241 |
| 5,309,389 | 5/1994 | Golke et al. .......................... | 365/104 |
| 5,457,647 | 10/1995 | McClure ............................... | 365/63 |
| 5,497,351 | 3/1996 | Oowaki ............................... | 365/230.03 |
| 5,619,466 | 4/1997 | McClure .............................. | 365/207 |
| 5,657,286 | 8/1997 | Arimoto ............................... | 365/205 |
| 5,663,905 | 9/1997 | Matsuo et al. ........................ | 365/149 |

FOREIGN PATENT DOCUMENTS

| | | |
|---|---|---|
| 5-101676 | 4/1993 | Japan . |
| 7-141881 | 6/1995 | Japan . |

OTHER PUBLICATIONS

Sasaki, Katsuro, et al.: "A 9–ns 1–Mbit CMOS SRAM", *Journal of Solid–State Circuits*, vol. 24, No. 5, Oct. 1989, pp. 727–732.

Wada, Tomohisa, et al: "A 34–ns 1–Mbit CMOS SRAM Using Triple Polysilicon", *IEEE Journal of Solid–State Circuits*, vol. SC–22, No. 5, Oct. 1987.

*Primary Examiner*—David C. Nelms
*Assistant Examiner*—Hoah Ho
*Attorney, Agent, or Firm*—McDermott, Will & Emery

[57] ABSTRACT

A static type semiconductor memory device includes a main bit line pair, and a plurality of memory blocks connected to the main bit line pair. Each of the memory blocks includes a local bit line pair, a static memory connected to the local bit line pair, an amplifier which amplifies potential difference between the paired local bit lines, and a data transfer gate which transfers data between the local bit line pair and the main bit line pair.

8 Claims, 10 Drawing Sheets

STATIC TYPE SEMICONDUCTOR MEMORY WITH LATCH CIRCUIT AMPLIFYING READ DATA READ ON A SUB BIT LINE PAIR AND TRANSFERRING THE AMPLIFIED READ DATA TO A MAIN BIT LINE PAIR AND OPERATION METHOD THEREOF

BACKGROUND OF THE INVENTION

1. Field of the Invention

The present invention relates to a semiconductor memory device, and more specifically relates to a static type semiconductor memory device.

2. Description of the Background Art

FIG. 9 is a block diagram showing an entire structure of a conventional static type semiconductor memory device.

The static type semiconductor memory device includes: memory cells 4; a word line WL shared by laterally aligned memory cells 4; a bit line pair BL, /BL shared by vertically aligned memory cells 4; a row decoder 6 responsive to an input address to select one word line WL; and a read/write circuit 10 connected to one end of bit line pair BL, /BL. Read/write circuit 10 externally transmits and receives data.

FIG. 10 shows an equivalent circuit of a static type semiconductor memory element as one example of memory cell 4 in FIG. 9. The static type semiconductor memory element is an SRAM memory cell of high resistance type utilizing load elements R1, R2 of high resistance, and includes access transistors Q1, Q2, driver transistors Q3, Q4, and storage nodes N1, N2. Access transistor Q1 has its gate connected to word line WL, and has its source and drain respectively connected to bit line BL and node N1. Access transistor Q2 has its gate connected to word line WL, and source and drain respectively connected to bit line /BL and node N2. The gate, source and drain of driver transistor Q3 are respectively connected to node N2, a ground node, and node N1. On the other hand, driver transistor Q4 has its gate connected to node N1, and source and drain respectively connected to ground node and node N2.

FIG. 11 shows an equivalent circuit of the static type semiconductor memory element showing another example of memory cell 4 in FIG. 9. The static type semiconductor memory element has a structure similar to that of the memory cell shown in FIG. 10 except that PMOS transistors Q50, Q60 are employed as load elements. (This memory cell is referred to as a CMOS type SRAM memory cell.) The gate of PMOS transistor Q50 is connected to node N2, the source is connected to a supply node, and the drain is connected to node N1. PMOS transistor Q60 has its gate connected to node N1, and has source and drain respectively connected to supply node and node N2.

In the high resistance type SRAM memory cell utilizing the load of high resistance for reducing the area of the memory cell, the load element is formed of polysilicon and arranged on NMOS transistors Q1, Q2, Q3, and Q4 on a silicon substrate. Similarly, in the CMOS type SRAM memory cell shown in FIG. 11, PMOS transistors Q50, Q60 are formed as thin film transistors on NMOS transistors Q1, Q2, Q3, and Q4.

An example of a memory cell in which the high resistance element is formed at an upper layer of transistors can be found in "A34-ns 1-Mbit CMOS SRAM Using Triple Polysilicon", *IEEE Journal of Solid-state Circuits*, Vol. SC22, No.5, October 1987, pp.727–732. An example of a memory cell utilizing the thin-film transistor is introduced in "A9-ns 1-Mbit CMOS SRAM", *IEEE Journal of Solid-state Circuits*, Vol.24, No.5, October 1989, pp.1219–1225.

In the conventional static type semiconductor memory device as described above, the number of memory cells connected to one bit line as well as load capacitance of the bit line increase if larger capacity should be attained. A problem which arises in this case is decrease of reading/writing speed due to the increased capacity.

Another problem is that drivability of the memory cell declines in low voltage operation. In addition, the data read from a memory cell can not be transferred to read/write circuit 10 since the load capacitance of bit line BL is large, or the difference in potential between period bit lines BL and /BL becomes too small to be detected by read/write circuit 10.

SUMMARY OF THE INVENTION

An object of the present invention is to provide a static type semiconductor memory device utilizing memory cells similar to the conventional ones without much decrease in reading speed even when storage capacity is increased. Another object of the present invention is to provide a static type semiconductor memory device utilizing similar memory cells to the conventional ones which has a large operating range at lower voltage side.

According to one aspect of the invention, a static type semiconductor memory device includes a plurality of main bit line pairs, a plurality of word lines, and a plurality of memory blocks connected to one of the plurality of main bit line pairs. Each of the plurality of memory blocks includes: a sub bit line pair; a static memory connected to the sub bit line pair and one of the plurality of word lines; an amplifier amplifying the potential difference between the paired sub bit lines; and a data transfer gate transferring data between the sub bit line pair and one of the plurality of main bit line pairs.

According to another aspect of the invention, in the static type semiconductor memory device, the static memory is provided with two driver transistors of a first conductivity type. The amplifier includes: a first transistor of a second conductivity type having its source connected to a first supply node, drain connected to one of the paired sub bit lines, and gate connected to the other of the paired sub bit lines; and a second transistor of the second conductivity type having its source connected to a second supply node, drain connected to the gate of the first transistor, and gate connected to the drain of the first transistor.

According to a further aspect of the invention, a static type semiconductor memory device includes a plurality of main bit line pairs, a plurality of word lines, and a plurality of memory blocks connected to one of the plurality of main bit line pairs. Each of the plurality of memory blocks includes a sub bit line pair, a static memory connected to the sub bit line pair and one of the plurality of word lines, an amplifier which amplifies potential difference between the paired sub bit lines, and a data transfer gate which transfers data between the sub bit line pair and one of the plurality of main bit line pairs. A method of operating the static type semiconductor memory device includes the steps of making the potential of one of the plurality of main bit line pairs equal to that of the sub bit line pair, selecting one of the plurality of word lines, amplifying data read onto the sub bit line pair from the static memory connected to the selected one of the plurality of word lines, and transferring the amplified data from the sub bit line pair to the main bit line pair.

According to a further aspect of the invention, a static type semiconductor memory device includes a plurality of main bit line pairs, a plurality of word lines, and a plurality of memory blocks connected to one of the plurality of main bit line pairs. Each of the plurality of the memory blocks includes a sub bit line pair, a static memory connected to the sub bit line pair and one of the plurality of word lines, an amplifier amplifying potential difference between the paired sub bit lines, and a data transfer gate transferring data between the sub bit line pair and one of the main bit line pairs. A method of operating the static type semiconductor memory device includes the steps of making the potential of one of the plurality of main bit line pairs equal to that of the sub bit line pair, selecting one of the plurality of word lines, amplifying data read from the static memory connected to the selected one of the plurality of word lines onto the sub bit line pair, transferring the amplified data from the sub bit line pair to one of the plurality of main bit line pairs, setting potential difference of one of the plurality of main bit line pairs corresponding to write data, transferring the potential difference of one of the plurality of main bit line pairs to the sub bit line pair via the data transfer gate and setting potential difference between the paired sub bit lines corresponding to write data, and transferring the potential difference between the paired sub bit lines to the static memory.

One advantage of the present invention is, therefore, that decrease in reading speed due to increased capacity can be minimized since the static type semiconductor memory device is provided with the sub bit line pair and the main bit line pair and data read onto the sub bit line pair is transferred to the main bit line pair.

Another advantage of the present invention is that the range of the operating voltage can be increased at lower voltage side since the static memory includes the driver transistor of the first conductivity type and the amplifier includes the transistor of the second conductivity type to form a latch circuit which amplifies data.

A further advantage of the present invention is that reading of data from the static memory can be performed at high speed and the operating range at lower voltage side can be increased since the amplified data is transferred from the sub bit line pair to the main bit line pair.

A further advantage of the invention is that writing of data to the static memory can be carried out at high speed and operating range at lower voltage side can be increased since write data is transferred from the main bit line pair to the sub bit line pair.

The foregoing and other objects, features, aspects and advantages of the present invention will become more apparent from the following detailed description of the present invention when taken in conjunction with the accompanying drawings.

BRIEF DESCRIPTION OF THE PREFERRED EMBODIMENTS

Figure 1:
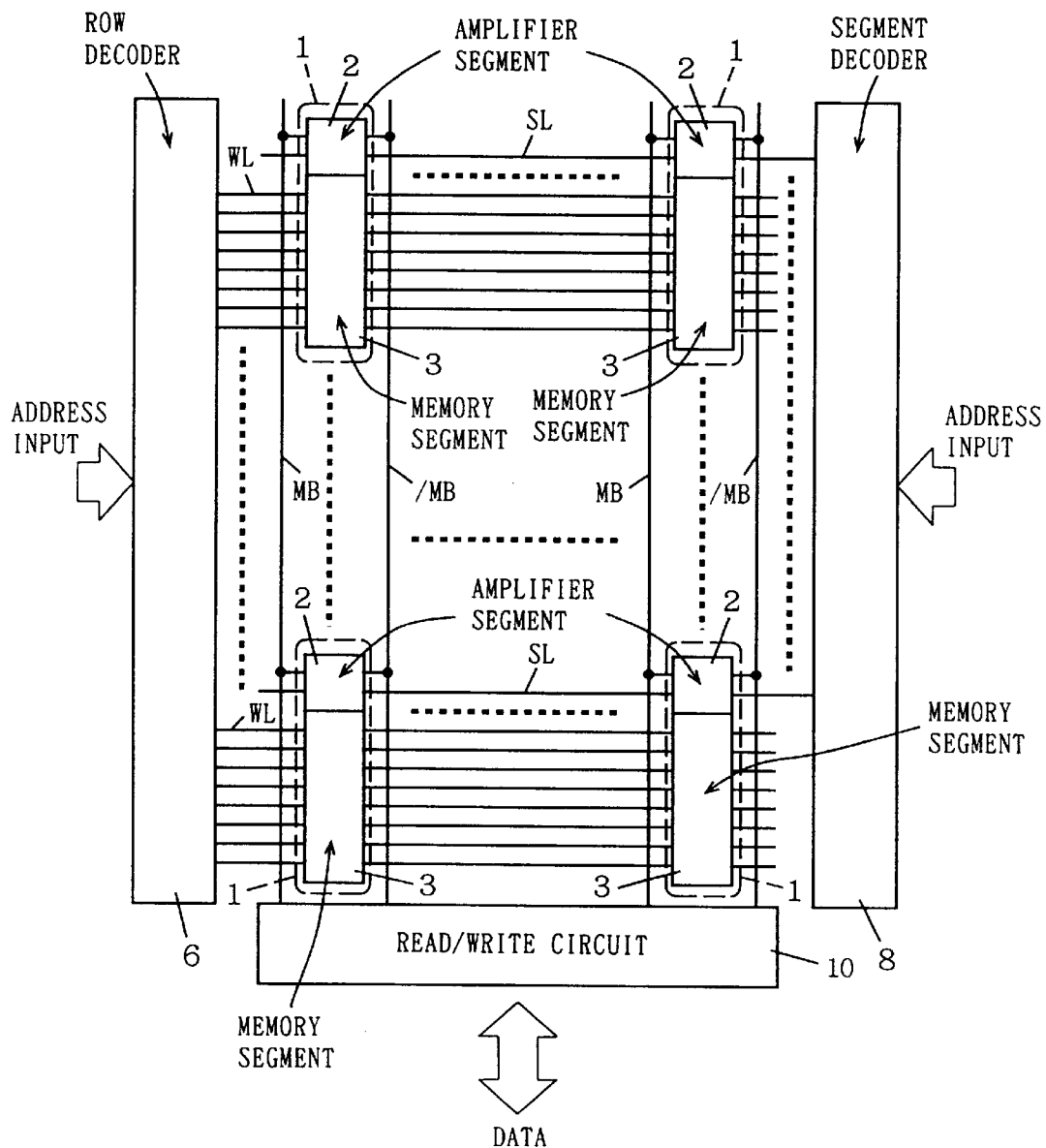
FIG. 1 is a block diagram showing an entire structure of a static type semiconductor memory device according to the first embodiment of the invention.

Embodiments of the present invention will be specifically described with reference to the drawings. Like reference characters denote the identical or the corresponding parts in the drawings.

[First Embodiment]

FIG. 1 is a block diagram showing an entire structure of a static type semiconductor memory device according to the first embodiment of the invention. As shown in FIG. 1, the static type semiconductor memory device includes: a main bit line pair MB, /MB; a memory block 1 disposed two dimensionally between the paired main bit lines MB and /MB and includes an amplifier segment 2 and a memory segment 3; a word line WL; a row decoder 6 responsive to an input address for selectively activating word line WL; a segment decoder 8 responsive to an input address for selectively activating a segment selection line SL; and a read/write circuit 10 connected to one end of main bit line pair MB, /MB for externally transmitting and receiving data. A precharge signal /Pc supplied to amplifier segment 2 is generated in row decoder 6 or segment decoder 8 (not shown).

Figure 2:
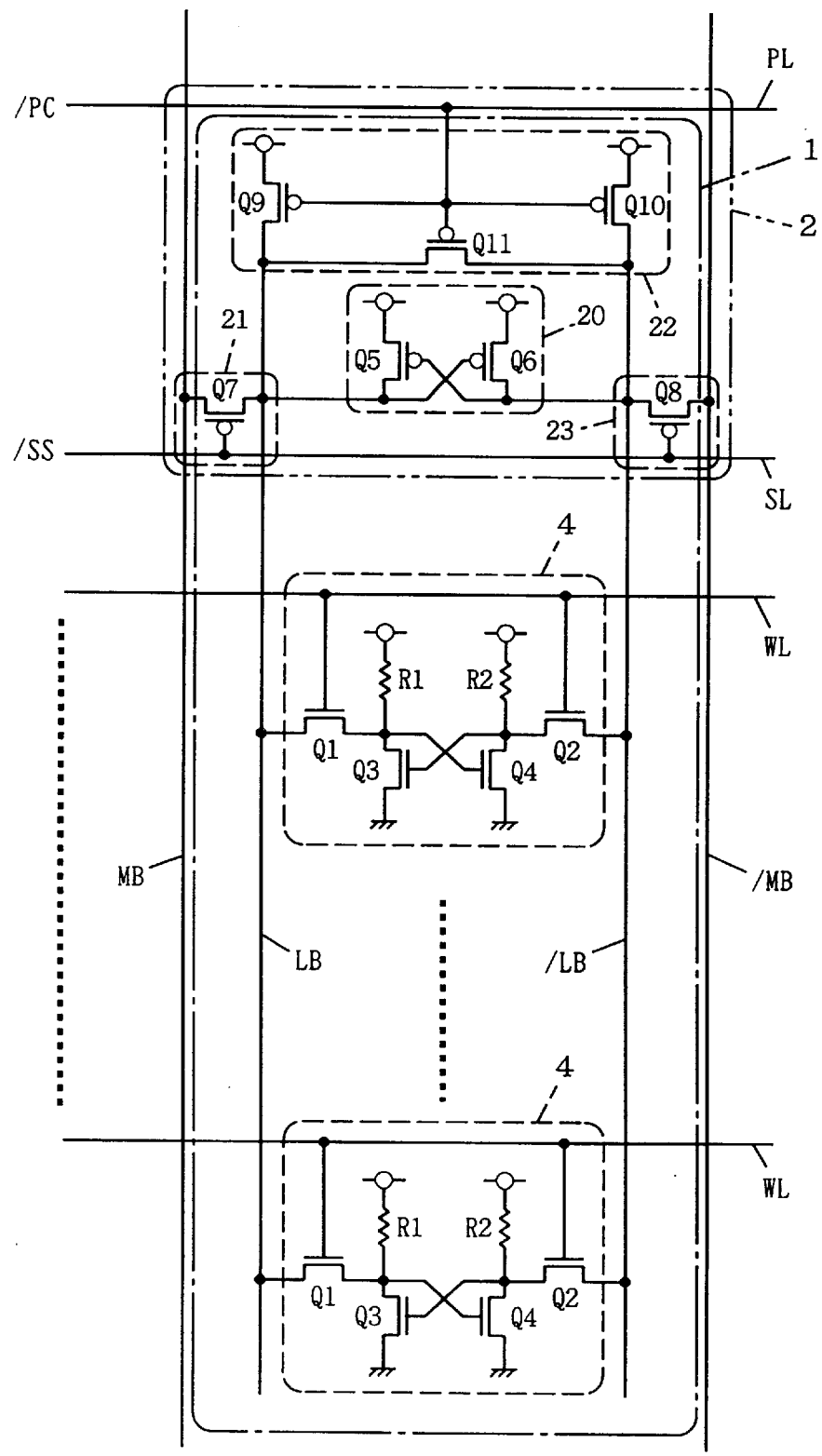
FIG. 2 is a circuit diagram showing a structure of a memory block shown in FIG. 1.

FIG. 2 is a circuit diagram specifically showing the structure of memory block 1 shown in FIG. 1.

As shown in FIG. 2, memory block 1 includes a local bit line pair LB, /LB, a memory cell 4 disposed between paired local bit lines LB and /LB, and amplifier segment 2. Local bit line pair LB, /LB and a plurality of memory cells 4 arranged therebetween are included in memory segment 3.

Figure 11:
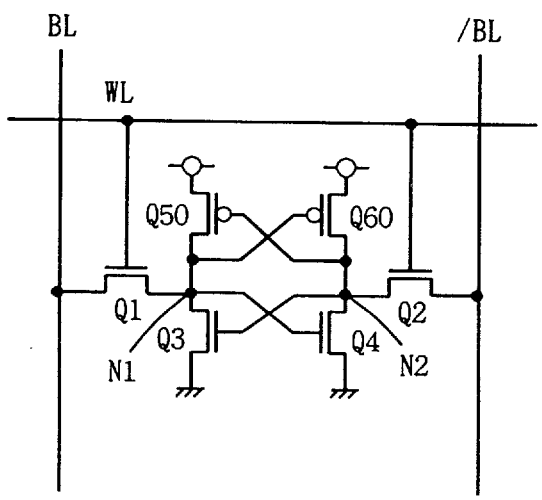
FIG. 11 is a circuit diagram showing a structure of a conventional SRAM memory cell of CMOS type.

Memory cell 4 includes driver transistors Q3, Q4, access transistors Q1, Q2, and load elements R1, R2. Although load elements R1, R2 are resistors as shown in FIG. 2, they may be PMOS transistors Q50, Q60 shown in FIG. 11 or thin-film transistors.

Amplifier segment 2 includes an amplifier 20 connected to local bit line pair LB, /LB, data transfer gates 21, 23 which transfer data between local bit line pair LB, /LB and main bit line pair MB, /MB, and a precharge portion 22 which precharges local bit line pair LB, /LB. Amplifier 20 includes PMOS transistor Q5 having its source, drain and gate respectively connected to a supply node, local bit line LB, and local bit line /LB, as well as PMOS transistor Q6 having its source, drain and gate respectively connected to supply node, the gate of PMOS transistor Q5, and the drain of PMOS transistor Q5. Amplifier 20 is combined with driver transistors Q3, Q4 of memory cell 4 connected to an activated word line WL and constitutes a latch circuit. Accordingly, data in memory cell 4 transferred to local bit line pair LB, /LB is amplified.

Data transfer gate 21 includes PMOS transistor Q7 having its gate connected to segment selection line SL intersecting with local bit line pair LB, /LB and main bit line pair MB, /MB, source and drain respectively connected to main bit line MB or local bit line LB. Data transfer gate 23 includes PMOS transistor Q8 having its gate connected to segment selection line SL, and source and drain respectively connected to main bit line /MB or local bit line /LB.

PMOS transistors Q7, Q8 turn on when an activated segment selection signal /SS is supplied to the gates, and data is transferred between local bit line pair LB, /LB and main bit line pair MB, /MB.

A precharge portion 22 includes PMOS transistors Q9, Q10 having their sources, drains and gates respectively connected to supply nodes, local bit line pair LB, /LB and precharge signal line PL, as well as PMOS transistor Q11 having its source and drain connected to local bit line pair LB, /LB, and gate connected to a precharge signal line PL. When an activated precharge signal /Pc is supplied to the gates of PMOS transistors Q9, Q10, Q11 via precharge signal line PL, PMOS transistors Q9 and Q10 turn on, and local bit lines LB and /LB are precharged to supply potential. The potentials of paired local bit lines LB and /LB are made equal when PMOS transistor Q11 turns on.

Figure 3:
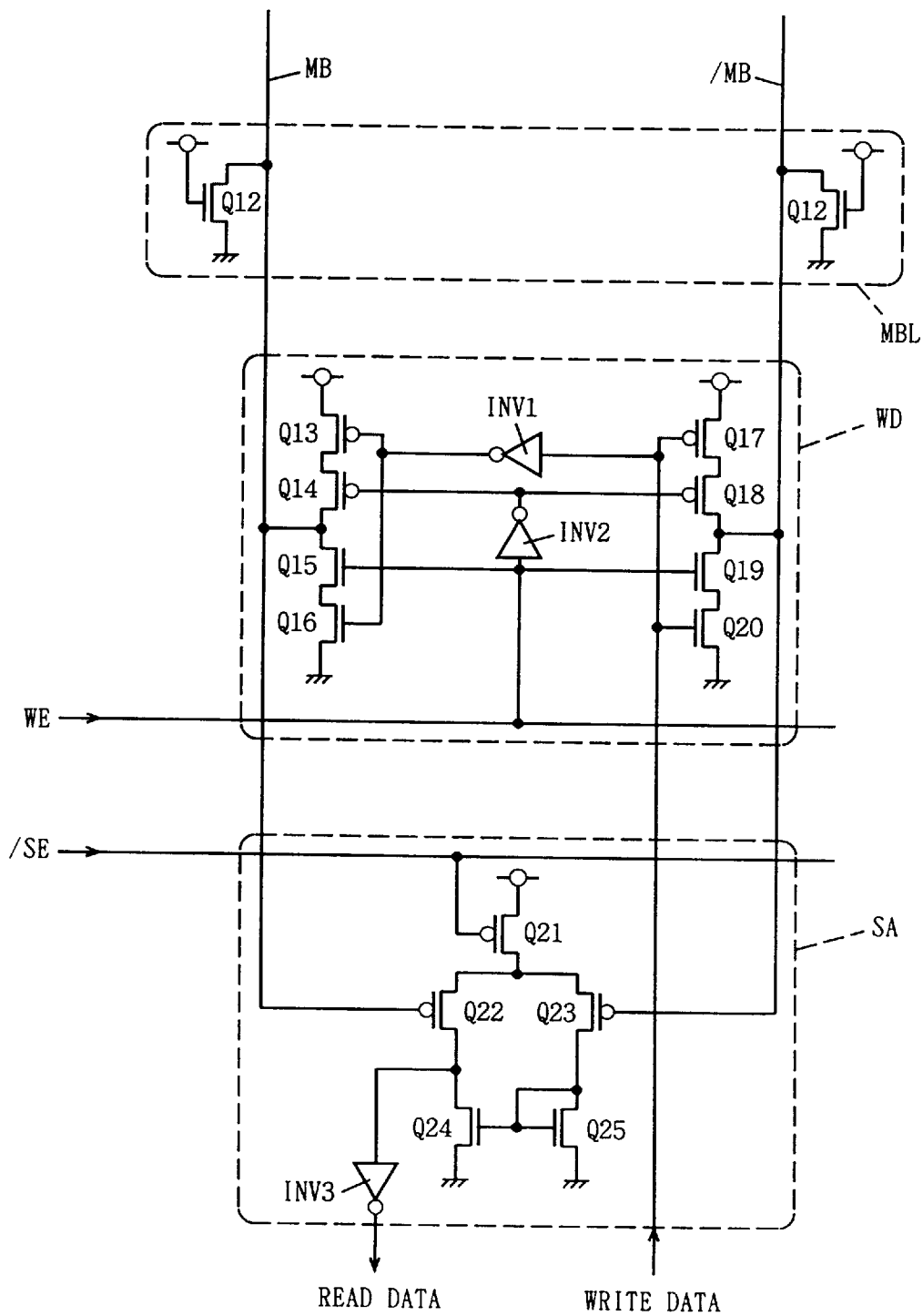
FIG. 3 is a circuit diagram illustrating a structure of a read/write circuit shown in FIG. 1.

FIG. 3 is a circuit diagram showing a specific structure of read/write circuit 10 of FIG. 1.

As shown in FIG. 3, read/write circuit 10 includes a load circuit MBL, a write driver WD, and a sense amplifier SA.

Load circuit MBL includes NMOS transistor Q12 having its source connected to ground node, drain connected to main bit line MB or /MB, and gate connected to supply node. NMOS transistor Q12 is constantly in ON state and main bit line pair MB, /MB is precharged to low level.

Write driver WD is formed of a three-state buffer controlled by a write control signal WE. When write control signal WE is activated, NMOS transistors Q15, Q19 and PMOS transistors Q14, Q18 turn on, and externally supplied write data is transferred to main bit line pair MB, /MB. The data on main bit line pair MB, /MB is transferred to local bit line pair LB, /LB via PMOS transistors Q7, Q8 shown in FIG. 2. The data transferred to local bit line pair LB, /LB is transferred to a storage node of memory cell 4 via access transistors Q1, Q2.

Sense amplifier SA includes PMOS transistors Q21, Q22, Q23, NMOS transistors Q24, Q25, and an inverter INV3. Sense amplifier SA differentially amplifies voltage difference between paired main bit lines MB and /MB when an activated sense amplifier control signal /SE is supplied, and outputs data read from memory cell 4 from an output node of inverter INV3.

Referring to the timing charts shown in FIGS. 4A–4H, reading operation of the static type semiconductor memory device according to the first embodiment of the invention will be described.

Figure 4:
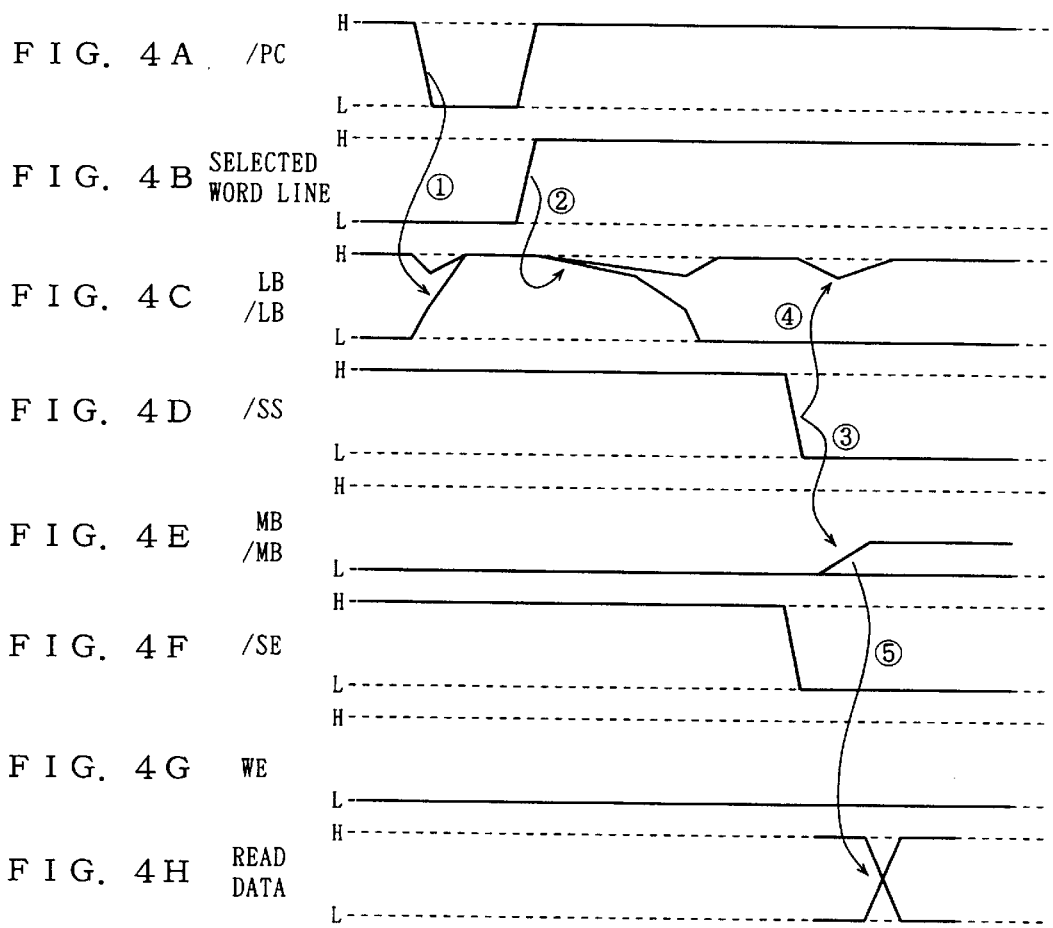
FIGS. 4A–4H are timing charts relating to an operation of reading data of the static type semiconductor memory device shown in FIG. 1.

Prior to reading operation, the level of precharge signal /Pc is made low as shown in FIG. 4A. As shown in FIG. 4C, PMOS transistors Q9, Q10, Q11 of FIG. 2 turn on and local bit line pair LB, /LB is precharged to supply potential and set at equal potential (①).

As shown in FIG. 4B, row decoder 6 decodes an input address and activates a selected word line to high level. Access transistors Q1, Q2 included in memory cell 4 turn on and potential difference caused by the data stored in memory cell 4 is produced between paired local bit lines LB and /LB as shown in FIG. 4C (②).

The potential difference between paired local bit lines LB and /LB is amplified to its maximum by the combination of PMOS transistors Q5, Q6 contained in amplifier 20 and driver transistors Q3, Q4 contained in memory cell 4 as shown in FIG. 4C. The potential difference between local bit lines LB and /LB is thus maximized so that rewrite operation of data is carried out even if data in the storage node included in memory cell 4 is broken when data is read from memory cell 4, and the data in the storage node included in memory cell 4 is retained.

As shown in FIG. 4D, segment selection line SL is activated and data on local bit line pair LB, /LB is transferred to main bit line pair MB, /MB (③).

As shown in FIG. 4F, when sense amplifier control signal /SE is activated, data transferred to main bit line pair MB, /MB is sensed and amplified in sense amplifier SA included in read/write circuit 10. The amplified data is output as read data from the output node of inverter INV3 as shown in FIG. 4H (⑤).

Relatively high speed drive can be achieved by increasing the size of the PMOS transistor included in amplifier segment 2 even if the capacitance of main bit line pair MB, /MB is large. The number of PMOS transistors Q7, Q8 connected to main bit line pair MB, /MB can be decreased compared with the number of memory cells connected to bit line pair BL, /BL in the conventional static type semiconductor memory device. As a result, the capacitance of main bit line pair MB, /MB can be decreased thereby attaining a still higher speed data transfer.

The potential difference between paired local bit lines LB and /LB is influenced by the transfer of data on local bit line pair LB, /LB onto main bit line pair MB, /MB. The influence of the potential difference between paired local bit lines LB and /LB can be decreased as shown in FIG. 4C, for example, by setting the ratio of transistor size of PMOS transistor Q5 or Q6 and PMOS transistor Q7 or Q8 included in amplifier segment 2 to 3 to 1(④).

Next with reference to the timing charts of FIGS. 5A–5H, writing operation of the static type semiconductor memory device according to the first embodiment of the invention will be described.

Figure 5:
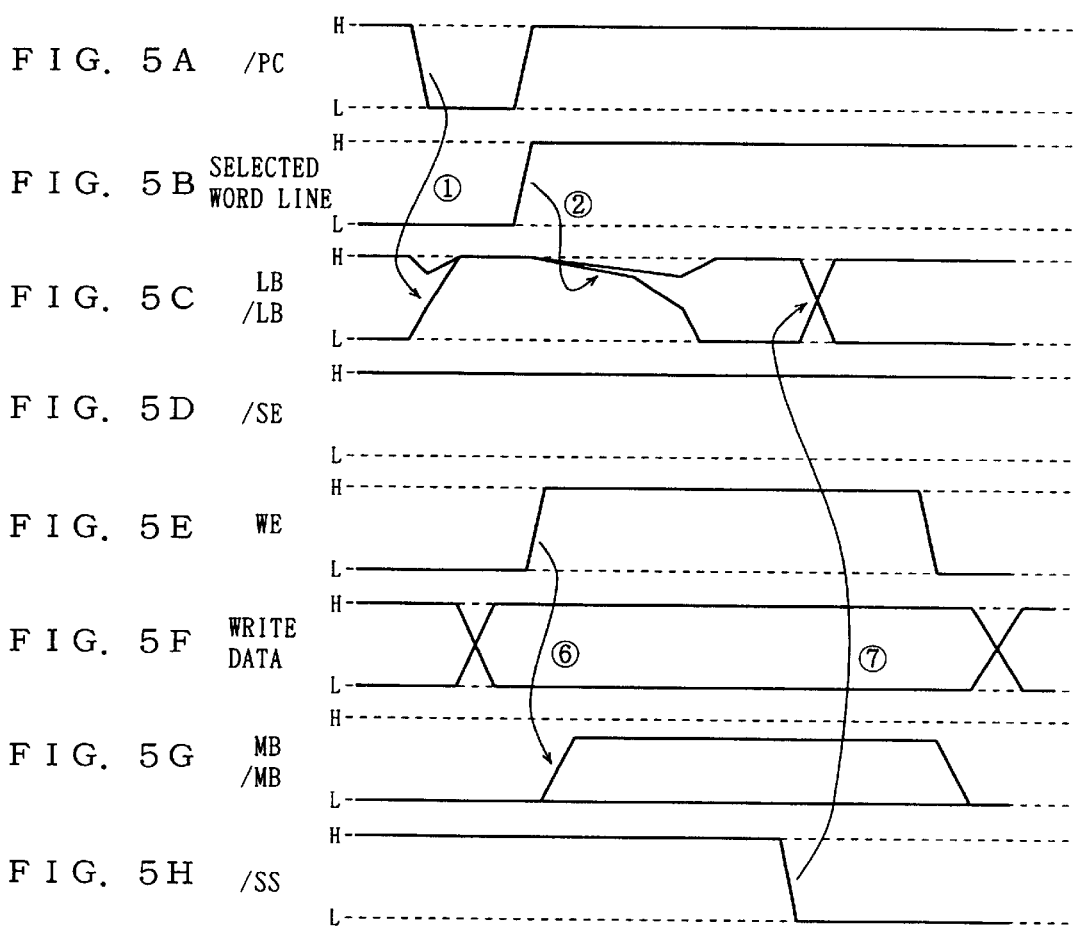
FIGS. 5A–5H are timing charts relating to writing operation of data of the static type semiconductor memory device shown in FIG. 1.

Similar to the reading operation, precharge signal /Pc is activated to low level as shown in FIG. 5A. Potential of local bit line pair LB, /LB is precharged to supply potential and made equal ((①)). At this time, the potential of main bit line pair MB, /MB is set at ground potential by load circuit MBL included in read/write circuit 10.

As shown in FIG. 5B, word line WL is selected and activated to high level by row decoder 6. As shown in FIG. 5C, data is read from memory cell 4 connected to the activated word line WL onto local bit line pair LB, /LB (②).

The data read from memory cell 4 onto local bit line pair LB, /LB is amplified to its maximum by the combination of PMOS transistors Q5, Q6 included in amplifier 20 and driver transistors Q3, Q4 included in memory cell 4 as shown in FIG. 5C.

As shown in FIG. 5E, when write control signal WE becomes high level, write driver WD included in read/write circuit 10 is activated, and externally supplied write data is transferred to main bit line pair MB, /MB as shown in FIG. 5G (⑥).

As shown in FIG. 5H, when segment selection signal /SS is activated to low level, PMOS transistors Q7, Q8 included in data transfer gates 21, 23 turn on, data on main bit line pair MB, /MB is transferred to local bit line pair LB, /LB (⑦), and further transferred to the storage node of memory cell 4 via access transistors Q1, Q2.

In the static type semiconductor memory device according to the first embodiment of the invention, main bit lines MB, /MB can be driven at relatively high speed even if the capacitance of main bit lines MB, /MB is large. The number of PMOS transistors Q7, Q8 connected to main bit line pair MB, /MB can be decreased compared with the number of memory cells connected to bit line pair BL, /BL in the conventional static type semiconductor memory device. The capacitance of main bit line pair MB, /MB can thus be decreased, and data can be transferred at still higher speed.

At the time of reading/writing of data, rewrite operation of data is performed when data in the storage node included in memory cell 4 is broken, and the data in memory cell 4 is eventually retained, so that operating range, specially in low voltage operation can be increased. Accordingly, a static type semiconductor memory device operating in the large voltage range can thus be obtained.

[Second Embodiment]

Figure 6:
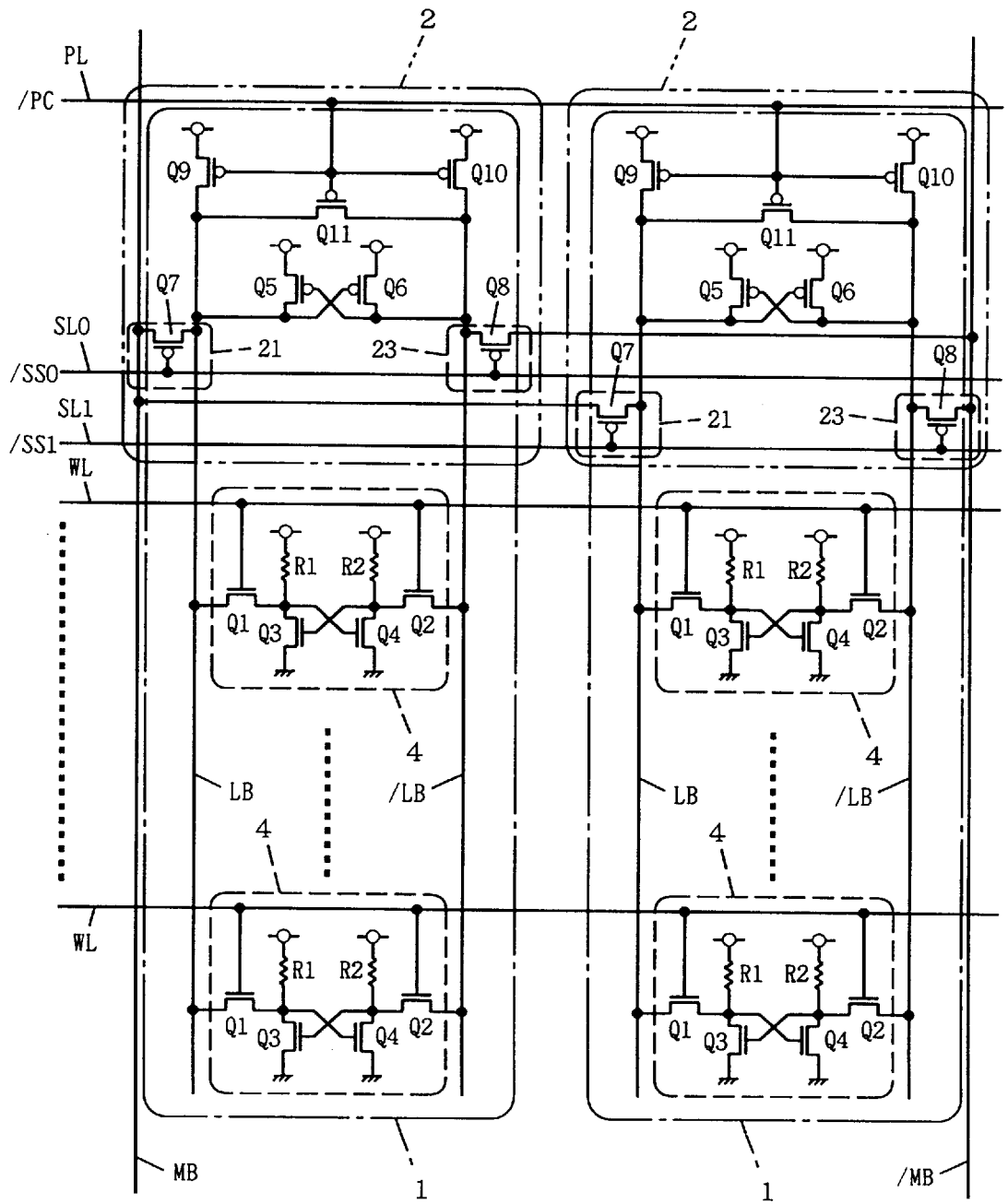
FIG. 6 is a circuit diagram showing a structure of a static type semiconductor memory device according to the second embodiment of the present invention.

FIG. 6 is a circuit diagram showing a structure of a static type semiconductor memory device according to the second embodiment of the invention.

As shown in FIG. 6, the static type semiconductor memory device according to the second embodiment has a structure similar to that according to the first embodiment. In the second embodiment, two memory blocks 1 are disposed between paired main bit lines MB and /MB in the direction intersecting with main bit line pair MB, /MB. A segment selection line SL0 is connected to the gates of PMOS transistors Q7, Q8 included in one of the memory blocks 1. Segment selection line SL1 is connected to the gates of PMOS transistors Q7, Q8 included in the other of the memory blocks 1.

This structure allows each of memory blocks 1 arranged between paired main bit lines MB and /MB to operate similarly to memory block 1 according to the first embodiment. The space between paired main bit lines MB and /MB can thus be increased since one pair of main bit line pair MB, /MB is placed for a plurality of memory blocks, so that manufacturing yield can be improved.

[Third Embodiment]

According to the first and second embodiments of the invention, a plurality of memory blocks 1 are connected to segment selection lines SL, SL0, SL1 in the static type semiconductor memory device as shown in FIGS. 1 and 6. As a result, if segment selection lines SL, SLO, SL1 are selected, data read from memory cell 4 is transferred to all of the main bit line pairs MB, /MB. When the number of input/output pins is small, 1 or 4, for example, in a structure of a memory device, excessive power would be consumed if more data than that which is input/output by those pins is read onto main bit line pair MB, /MB at a time. For example, in the static type semiconductor memory device according to the first embodiment, direct current is caused to flow to load circuit MBL in read/write circuit 10 from amplifier segment 2 while segment selection line SL is activated.

Figure 7:
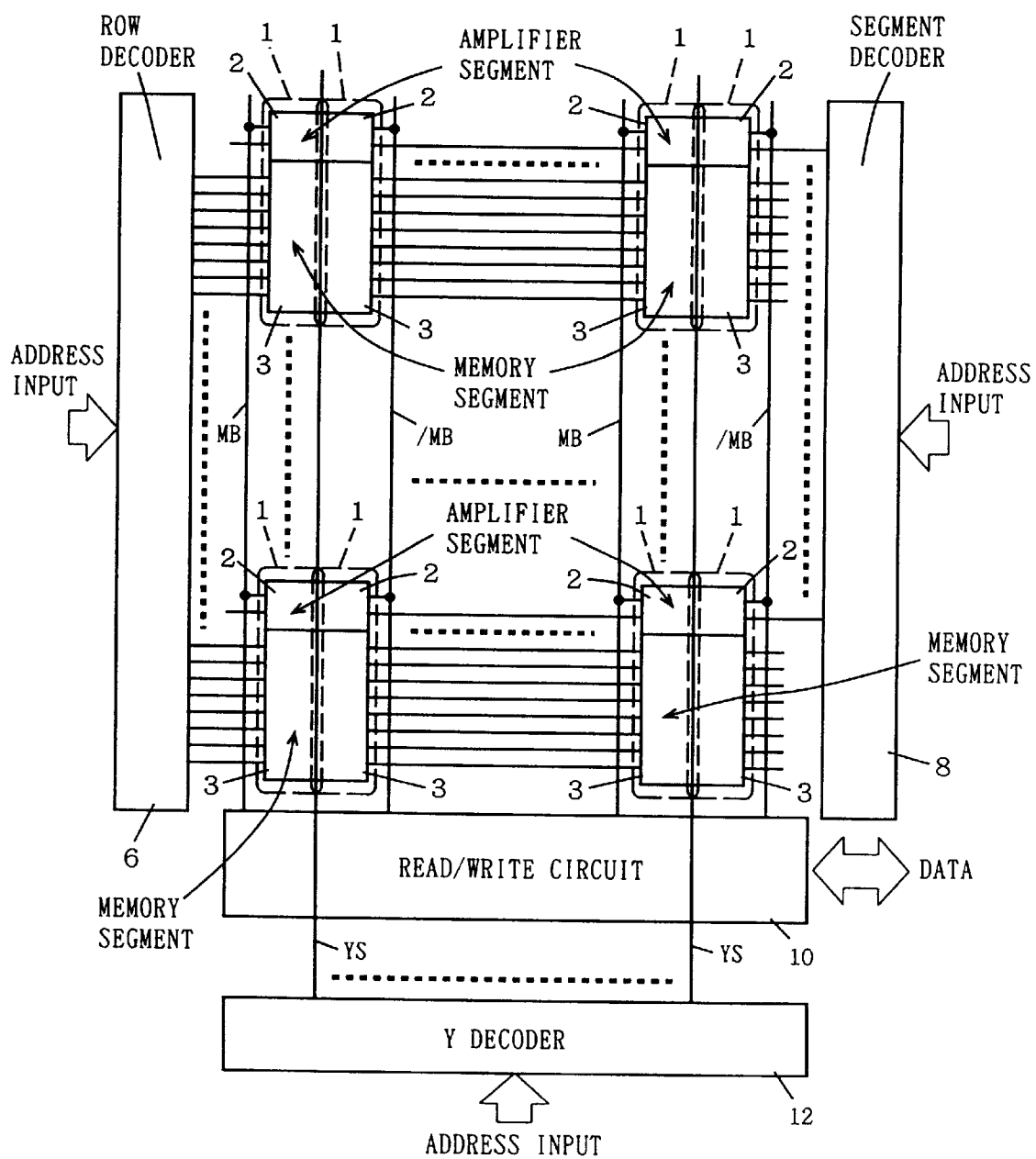
FIG. 7 is a block diagram showing an entire structure of a static type semiconductor memory device according to the third embodiment of the invention.

FIG. 7 is a block diagram showing an entire structure of a static type semiconductor memory device according to the third embodiment provided in order to solve the above described problem.

As shown in FIG. 7, the static type semiconductor memory device of the third embodiment, having a structure similar to that of the second embodiment, has a Y selection line YS placed between paired main bit lines MB and /MB. A Y decoder 12 is provided at one end of Y selection line YS. Y decoder 12 is responsive to an input address and selectively activates Y selection line YS.

Figure 8:
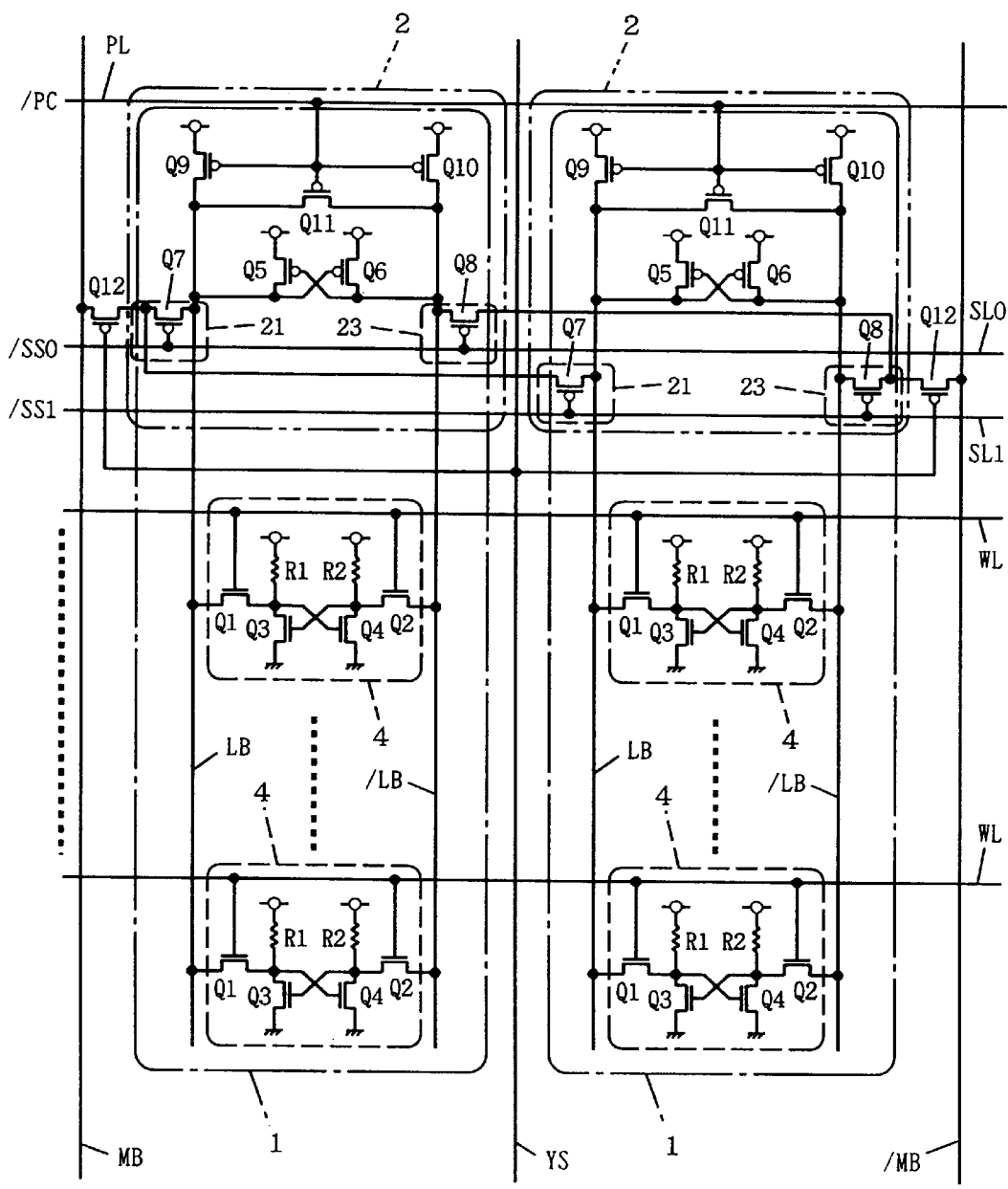
FIG. 8 is a circuit diagram showing specifically a structure of the static type semiconductor memory device shown in FIG. 7.
Figure 9:
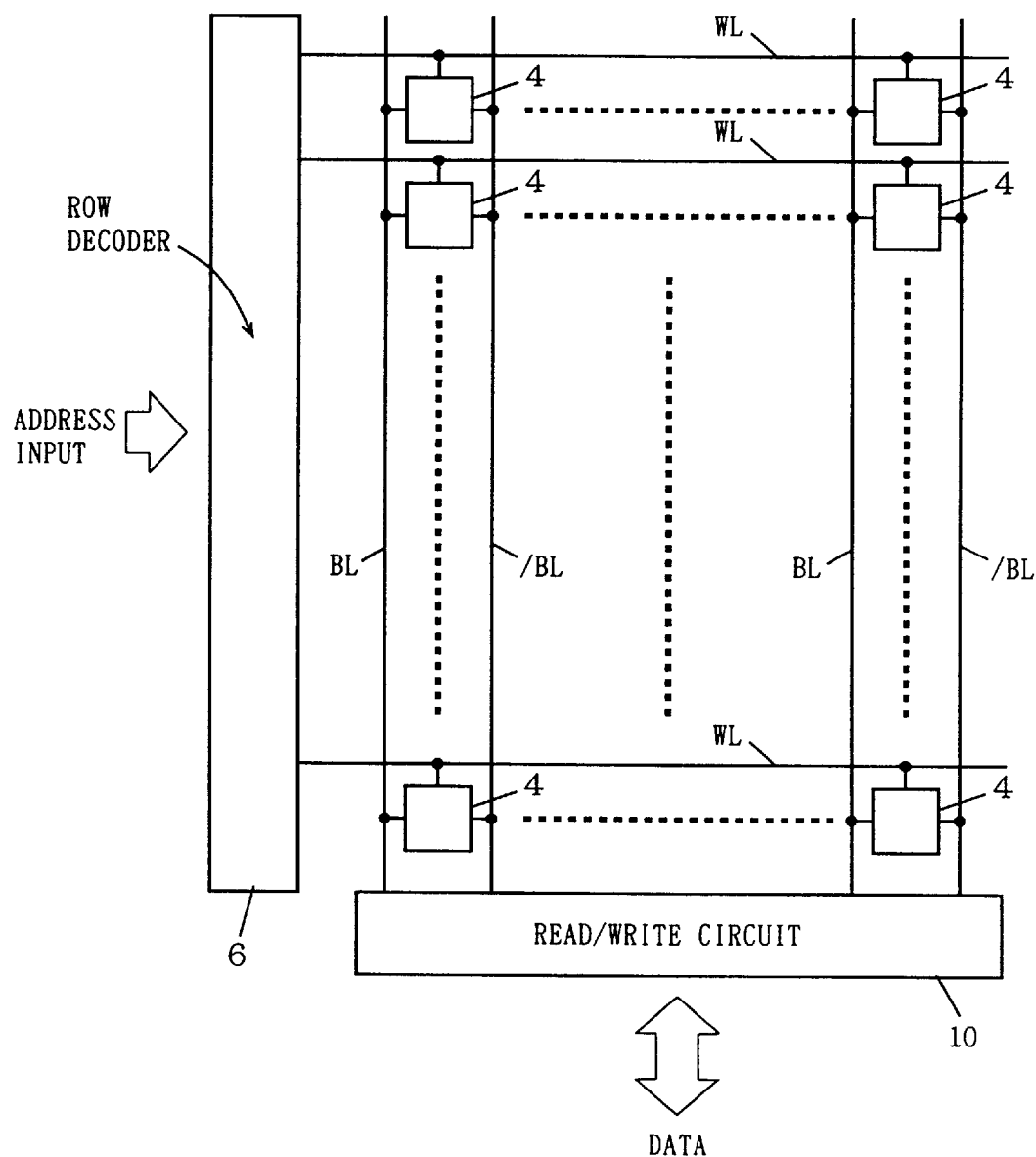
FIG. 9 is a block diagram showing an entire structure of a conventional static type semiconductor memory device.
Figure 10:
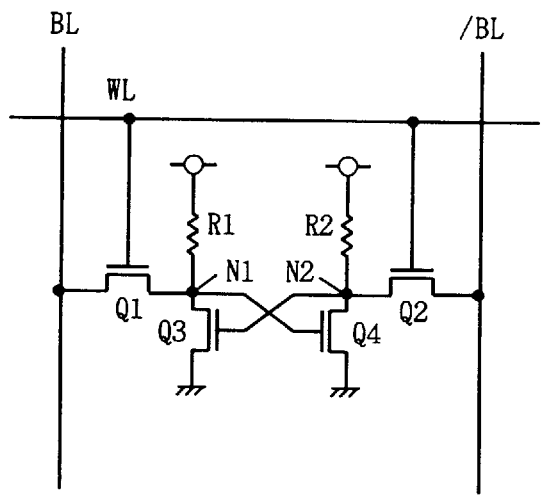
FIG. 10 is a circuit diagram showing a structure of a conventional SRAM memory cell of high resistance type.

FIG. 8 is a circuit diagram showing a specific structure of the static type semiconductor memory device shown in FIG. 7. As shown in FIG. 8, PMOS transistor Q12 is connected between data transfer gates 21, 23 and paired main bit lines MB and /MB. The gate of PMOS transistor Q12 is connected to Y selection line YS.

The static type semiconductor memory device according to the third embodiment operates similarly to the static type semiconductor memory device of the second embodiment. In the third embodiment, PMOS transistor Q12 is turned on only when Y selection line YS is activated, so that data on local bit line pair LB, /LB is transferred only to the main bit line pair MB and /MB sandwiching the activated Y selection line YS.

In the static type semiconductor memory device according to the third embodiment, data transfer is carried out between local bit line pair LB, /LB and main bit line pair MB, /MB at only one portion of the device, so that consumption of power can be decreased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static type semiconductor memory device comprising:
   a plurality of main bit line pairs;
   a plurality of word lines; and
   a plurality of memory blocks connected to one of said plurality of main bit line pairs, each of said plurality of memory blocks including
      a sub bit line pair substantially parallel to said main bit line pairs,
      a static memory cell connected to said sub bit line pair and one of said plurality of word lines,
      an amplifier amplifying potential difference between said paired sub bit lines, and
      a data transfer gate transferring data between said sub bit line pair and one of said plurality of main bit line pairs; wherein
      said static memory includes two driver transistors of a first conductivity type, and
      said amplifier includes only two transistors,
         a first transistor of a second conductivity type having its source, drain and gate respectively connected to a first power supply node, one sub bit line of said sub bit line pair, and the other of said sub bit line pair, and
         a second transistor of the second conductivity type having its source, drain and gate respectively connected to a second power supply node, the gate of said first transistor, and the drain of said first transistor.

2. The static type semiconductor memory device according to claim 1, wherein
   said data transfer gate includes a third transistor of said second conductivity type selectively connecting said sub bit line pair and one of said main bit line pairs.

3. The static type semiconductor memory device according to claim 2, further including a selection line connected to the gate of said third transistor and orthogonally intersecting with said main bit line pairs.

4. The static type semiconductor memory device according to claim 1, wherein
   said data transfer gate includes
      a third transistor of said second conductivity type connected to said sub bit line pair and controlled by a row selection signal, and fourth transistor of said second conductivity type connected between said third transistor and one of said main bit line pairs, and controlled by a column selection signal.

5. A static type semiconductor memory device comprising:
   a plurality of main bit line pairs;
   a plurality of word lines; and
   a plurality of memory blocks connected to one of said plurality of main bit line pairs, each of said plurality of memory blocks including
      a sub bit line pair,
      a static memory cell connected to said sub bit line pair and one of said plurality of word lines,
      an amplifier amplifying potential difference between said paired sub bit lines, and
      a data transfer gate transferring data between said sub bit line pair and one of said plurality of main bit line pairs; wherein
         at least two of said plurality of memory blocks are placed between one pair of said plurality of main bit line pairs, and arranged in a direction orthogonally crossing said plurality of main bit line pairs.

6. A method of operating a static type semiconductor memory device including:
   a plurality of main bit line pairs;
   a plurality of word lines; and
   a plurality of memory blocks connected to one of said plurality of main bit line pairs, each of said plurality of memory blocks including
      a sub bit line pair substantially parallel to said main bit line pairs,
      a static memory cell connected to said sub bit line pair and one of said plurality of word lines,
      an amplifier amplifying potential difference between said paired sub bit lines, and
      a data transfer gate transferring data between said sub bit line pair and one of said plurality of main bit line pairs, wherein
         said static memory includes two driver transistors of a first conductivity type, and
         said amplifier includes only two transistors,
            a first transistor of a second conductivity type having its source, drain and gate respectively connected to a first power supply node, one sub bit line of said sub bit line pair, and the other of said sub bit line pair, and
            a second transistor of the second conductivity type having its source, drain and gate respectively connected to a second power supply node, the gate of said first transistor, and the drain of said first transistor,
   the method comprising the steps of:
      equalizing potentials of one of said plurality of main bit line pairs and said sub bit line pair;
      selecting one of said plurality of word lines;
      amplifying data read onto said sub bit line pair from said static memory cell connected to the selected one of said plurality of word lines; and
      transferring said amplified data from said sub bit line pair to one of said main bit line pairs.

7. A method of operating a static type semiconductor memory device including:
   a plurality of main bit line pairs;
   a plurality of word lines; and
   a plurality of memory blocks connected to one of said plurality of main bit line pairs, each of said plurality of memory blocks including
      a sub bit line pair substantially parallel to said main bit line pairs,
      a static memory cell connected to said sub bit line pair and one of said plurality of word lines,
      an amplifier amplifying potential difference between said paired sub bit lines, and
      a data transfer gate transferring data between said sub bit line pair and one of said plurality of main bit line pairs, wherein
         said static memory includes two driver transistors of a first conductivity type, and
         said amplifier includes only two transistors,
            a first transistor of a second conductivity type having its source, drain and gate respectively connected to a first power supply node, one sub bit line of said sub bit line pair, and the other of said sub bit line pair, and
            a second transistor of the second conductivity type having its source, drain and gate respectively connected to a second power supply node, the gate of said first transistor, and the drain of said first transistor,
   said method comprising the steps of:
      equalizing potentials of one of said plurality of main bit line pairs and said sub bit line pair;
      selecting one of said plurality of word lines;
      amplifying data read onto said sub bit line pair from said static memory cell connected to the selected one of said plurality of word lines;
      transferring said amplified data from said sub bit line pair to one of said plurality of main bit line pairs;
      providing write data to one of said plurality of main bit line pairs;
      transferring the write data from one of said plurality of main bit line pairs to said sub bit line pair by said data transfer gate; and
      storing the write data of said sub bit line pair in said static memory cell.

8. The static type semiconductor memory device according to claim 5, wherein said sub bit line pair is substantially parallel to said main bit line pairs.

* * * * *